US012267069B1

(12) United States Patent
Grant et al.

(10) Patent No.: US 12,267,069 B1
(45) Date of Patent: Apr. 1, 2025

(54) SINGLE-EVENT EFFECT TOLERANT REGISTER

(71) Applicant: Apogee Semiconductor, Inc., Plano, TX (US)

(72) Inventors: David A. Grant, Dallas, TX (US); Noah C. Parker, Plano, TX (US)

(73) Assignee: Apogee Semiconductor, Inc., Plano, TX (US)

( * ) Notice: Subject to any disclaimer, the term of this patent is extended or adjusted under 35 U.S.C. 154(b) by 0 days.

(21) Appl. No.: 18/923,166

(22) Filed: Oct. 22, 2024

(51) Int. Cl.
*H03K 19/003* (2006.01)
*H03K 19/23* (2006.01)

(52) U.S. Cl.
CPC ....... *H03K 19/00369* (2013.01); *H03K 19/23* (2013.01)

(58) Field of Classification Search
CPC ............. H03K 19/23; H03K 19/00392; H03K 19/0075; H03K 19/00384; H03K 19/007
See application file for complete search history.

(56) References Cited

U.S. PATENT DOCUMENTS

| | | | |
|---|---|---|---|
| 6,667,520 B1 | 12/2003 | Fulkerson | |
| 7,236,005 B1 * | 6/2007 | Yee | H03K 19/23 326/11 |
| 8,884,643 B2 * | 11/2014 | Augustin | H03K 19/0075 326/110 |
| 9,191,009 B1 | 11/2015 | Clark et al. | |
| 9,344,067 B1 | 5/2016 | Wu et al. | |
| 10,715,143 B1 | 7/2020 | Alessandro et al. | |
| 11,791,831 B1 * | 10/2023 | Grant | H03K 19/23 341/155 |
| 11,847,084 B2 | 12/2023 | Hamlyn et al. | |
| 11,848,673 B1 | 12/2023 | Grant et al. | |

(Continued)

OTHER PUBLICATIONS

Aguiar et al., Design exploration of majority voter architectures based on the signal probability for TMR strategy optimization in space applications, JMicroRel, vol. 114, Nov. 2020, 113877. https://doi.org/10.1016/j.microrel.2020.113877.

(Continued)

*Primary Examiner* — Patrick C Chen
(74) *Attorney, Agent, or Firm* — Gregory A. Magel

(57) ABSTRACT

A resilient majority driver accepts triple-redundant input signals and provides a robust output signal unaffected by static errors on one of the input signals or by single-event transients caused by radiation within the driver. Data, clock, and asynchronous input signals to DICE (Dual Interlocked storage CEll) flip-flops in a register are driven by resilient majority drivers to construct an input-protected DICE register. Static errors are corrected using triple-redundant inputs and majority voting, while single-event strikes are largely corrected by the DICE architecture within each flip-flop and by the resilient majority drivers. Remaining errors in the input-protected DICE registers, such as those caused by single-event transients occurring during clock transitions, are corrected by error-correction encoders and decoders, whose output transients are suppressed by glitch filters. A resulting single-event effect tolerant register is more compact than a triple-redundant DICE register and requires no continuous external clock to correct errors.

24 Claims, 7 Drawing Sheets

(56) References Cited

U.S. PATENT DOCUMENTS

2007/0253240 A1* 11/2007 Manohar ............ G11C 11/4125
365/154
2011/0088008 A1 4/2011 Fifield et al.
2019/0020341 A1* 1/2019 Smith ................ H03K 3/02335

OTHER PUBLICATIONS

Calin et al., Upset Hardened Memory Design for Submicron CMOS Technology, EEE Transactions on Nuclear Science, vol. 43, No. 6, Dec. 1996, pp. 2874-2878.
Kumar et al., Low Power and High Reliable Triple Modular Redundancy Latch for Single and Multi-node Upset Mitigation, International Journal of Advanced Computer Science and Applications(IJACSA), vol. 10, No. 7, 2019, pp. 433-443. https://doi.org/10.14569/IJACSA.2019.0100760.
Hamed et al., Categorization and SEU Fault Simulations of Radiation-Hardened-by-Design Flip-Flops, Electronics, vol. 10, 2021, 1572. https://doi.org/10.3390/electronics 10131572.
Huang et al., A High Performance SEU-Tolerant Latch for Nanoscale CMOS Technology, JElectronTest, vol. 31, 2015, pp. 349-359. https://doi.org/10.1007/s10836-015-5533-5.
Berg et al., Revisiting Dual Interlocked Storage Cell (DICE) Single Event Upset (SEU) Sensitivity, Microelectronics Reliability & Qualification Working Meeting (MRQW) 2013, El Segundo, CA, Dec. 10-12, 2013. https://nepp.nasa.gov/files/25702/2013MRQW_Berg_n272.pdf.
Menouni et al., SEU tolerant memory design for the ATLAS pixel readout chip, JInst, vol. 8, 2013, C02026. https://doi.org/10.1088/1748-0221/8/02/C02026.
Baumann et al., Radiation Handbook for Electronics, Dallas, TX: Texas Instruments, 2019. https://www.ti.com/applications/industrial/aerospace-defense/space/radiation-handbook-for-electronics.html.

\* cited by examiner

SINGLE-EVENT EFFECT TOLERANT REGISTER

This invention was made with government support under Award Number 2304975, awarded by the National Science Foundation. The government has certain rights in the invention.

BACKGROUND OF THE INVENTION

1. Field of the Invention

The present invention relates generally to integrated circuits, and, more particularly, to integrated circuits designed to be tolerant of ionizing radiation.

2. Description of the Related Art

Integrated circuits (ICs) incorporating Metal-Oxide-Semiconductor (MOS) transistor devices are known to be susceptible to both destructive and nondestructive effects caused by exposure to energetic particles in high-radiation environments, including the natural space environment experienced by satellites and other space vehicles, as well as those encountered in some terrestrial medical, industrial, nuclear power, particle physics research, and military applications. In particular, nondestructive single-event effects (SEE) due to single-event transients (SET) caused by individual energetic ions traversing an electronic device can result in either transient or persistent errors in the functioning of integrated circuits. When single-event transients occur on a node of a storage element such as a memory cell, a latch, or a flip-flop in a register, a persistent error called a single-event upset (SEU) can result, in which an erroneous state may persist until it is corrected by writing new data into the storage element. Similarly, SET occurring on clock signals can cause incorrect data to be latched into a storage element, also causing a single-event upset error that can be propagated to downstream logic and processors.

Various approaches have been pursued to mitigate radiation effects in electronics required to operate with high reliability in high-radiation environments. Radiation Hardening By Process (RHBP) solutions modify a baseline semiconductor process to reduce radiation sensitivity. Such approaches increase cost and time to market and can have a negative impact on the circuit performance of a given design. Radiation Hardening By Design (RHBD) solutions encompass layout-based device and circuit changes, as well as higher-level redundant design, and can result in complete elimination of specific radiation-effect sensitivities, but require increased layout area, circuit complexity, and hence higher cost and power consumption. RHBD methods can be implemented without the need for custom process changes, and thus in many cases are able to use commercial processes, enabling radiation-hardened products to be brought quickly to market. RHBD improvements can take place at several levels: at the transistor device level, at the circuit layout level, or by applying higher-level redundancy techniques such as triple-modular redundancy (TMR) used in fault-tolerant systems. Other high-level system techniques used in providing fault tolerance include the use of error detection and correction (EDAC) techniques, for example, using error-correction codes within digital memories to correct SEUs at the bit level. In some systems, a single-event upset error can be corrected using additional circuitry to implement N-modular redundancy with majority voting (spatial redundancy); or an error may be tolerated for some period of time before the erroneous data is overwritten by correct data at a later clock cycle. Temporal redundancy techniques using separate sampling and latching at different clock times can also be employed. To utilize some of these temporal redundancy techniques, a regular system clock must be available in order that successive clock cycles may be used.

For the particular case of hardening an individual storage cell against SEU, a device-level spatially-redundant design known as the Dual Interlocked storage CEll (DICE) has been used in the design of radiation-hardened latches and flip-flops. The DICE approach uses doubly redundant drive elements: two transistors that are physically separated drive each sensitive data-state node, so that a single-event transient caused by an ion strike injects charge into only one of the two node transistors; and transistors associated with another data-state node maintain the overall data state through the ion-strike event owing to an interlocking state-restoring feedback function. A DICE latch structure requires approximately twice the area and twice the power of an unhardened latch, but provides several orders of magnitude improvement in the SEU rate, making a DICE latch or flip-flop substantially immune to SET at internal nodes. However, a DICE flip-flop remains vulnerable to SET at a data input during the clock setup and hold time, or to false clock events caused by SET at the clock input.

System-level reliability of registers that employ DICE flip-flops can be further enhanced by applying modular redundancy, typically triple-modular redundancy (TMR), using triplicated DICE registers to hold nominally-identical data, and performing majority voting that enables any single register holding an erroneous value in the logic path to be ignored, because the other two paths constitute a majority. But TMR increases circuit area and power consumption by at least another factor of three, including the area contributions of the triplicated registers and the majority voting circuitry.

There thus remains a need for novel radiation-hardened storage circuits demonstrating improved tolerance to single-event transients by reducing error probabilities for single-event upsets, and maintaining high performance while requiring minimal additional area, complexity, and power consumption.

SUMMARY OF THE INVENTION

Accordingly, radiation-hardened registers are provided that have high resiliency to single-event effects and immunity to single-event upsets, and thus high reliability in high-radiation environments encountered in space, medical imaging, and other applications. Data, clock, and asynchronous inputs to register flip-flops, which are preferably of a Dual Interlocked storage CEll (DICE) architecture, are driven by novel resilient majority drivers that accept triple-redundant input signals and protect register inputs from single-event transients and static input errors. Errors caused by single-event transients occurring during register setup and hold times that latch incorrect data are corrected in an area-efficient way using a parity register and error-correction circuitry to produce error-corrected output data. Unlatched transient errors at the output of an error-correction decoder are masked using a triple-redundant glitch filter to produce a robust triple-redundant output.

In particular, a resilient majority driver is provided that produces a robust and reliable driver output signal for driving a data, clock, or asynchronous input of a flip-flop in a register. Triple-redundant input signals are accepted by the resilient majority driver, which has a first stage of three digital majority voters, each connected to the triple-redundant input signals and generating first, second, and third majority outputs. The digital majority outputs of the first stage are connected to inputs of a second stage in the resilient majority driver consisting of at least three novel Muller C-elements that retain their output states in the event of transient input changes or single-event transients at an internal node. The novel Muller C-elements each comprise a voter segment that performs a portion of a majority voting function. Specifically, the three digital majority outputs are connected pairwise to the two inputs of voter segments in the Muller C-elements, such that a first Muller C-element has two voter segment inputs connected to the first and second digital majority outputs from the first stage, a second Muller C-element has two voter segment inputs connected to the second and third digital majority outputs from the first stage, and a third Muller C-element has two voter segment inputs connected to the first and third digital majority outputs from the first stage. Each novel Muller C-element generates an output that reflects agreement of the two inputs, in that the output is either an inverted or noninverted form of the signal at the two agreeing inputs. If a transient disagreement at the inputs occurs, or a single-event transient occurs at an internal node including at the output of C-element, the Muller C-element retains its previous state. The Muller C-element outputs are connected together at a summing node to produce an analog majority vote of the digital majority outputs. Through this combination of triple-modular redundancy (TMR), internal digital majority voting, Muller C-element state retention, and internal analog majority voting, a signal is produced at the driver output that is resilient to static single errors on the triple-redundant input signals and also to transient errors due to single-event transients at any node in the resilient majority driver.

In some embodiments of the resilient majority driver, fourth, fifth, and sixth novel Muller C-elements are connected in the same way as the first, second, and third Muller C-elements to the pairs of digital majority outputs, their outputs also connected to the summing node. A smaller-amplitude transient on the total driver output signal is produced by a single-event transient in one of the six Muller C-elements than would be caused by a similar transient in one of three Muller C-elements connected to the summing node. In some embodiments, each Muller C-element further includes an output stage having a lower output impedance and thus a higher resilience to single-event strikes than would be provided directly by a Muller C-element comprising only minimum-size series voter segment transistors. Combining TMR inputs, internal digital voting, internal analog voting, duplicated Muller C-elements, and compact low-impedance output stages produces a particularly robust and reliable driver output signal while retaining high-speed capability.

An input-protected register is also provided that has at least one flip-flop having a data input, a clock input, and an output, and wherein resilient majority drivers as have just been described are used to drive the data and clock inputs from triple-redundant data and clock input signals. In some embodiments, the register is an n-bit wide register having n data inputs driven by n resilient majority drivers, each resilient majority driver accepting one triple-redundant bit from n-bit triple-redundant data buses. In some embodiments, the flip-flops are D flip-flops. In some embodiments, the flip-flops have a Dual Interlocked storage CEll (DICE) latch architecture. In some embodiments, one or more of the flip-flops has a reset input driven by a resilient majority driver accepting a triple-redundant reset input signal.

Finally, a single-event effect tolerant register is provided that incorporates the novel circuit elements previously described and their various advantages, together with the use of DICE flip-flops, error-correction circuitry, and optional glitch filters, resulting in a compact and low-complexity design having excellent immunity to single-event effects as well as static input errors, while not requiring a continuous clock to implement error correction. The single-event effect tolerant register accepts a triple-redundant n-bit wide data input, and outputs error-corrected n-bit triple-redundant output data. The n-bit input data are provided to a triple-redundant error-correction encoder that produces a triple-redundant p-bit wide parity signal. The data inputs of a DICE architecture n-bit data register are driven by an n-bit resilient majority driver, and a triple-redundant clock is also accepted by a resilient majority driver that drives the register's clock input. The inputs of a DICE architecture p-bit parity register, whose clock is driven by the same clock that drives the data register, are supplied by the outputs of a p-bit resilient majority driver accepting the triple-redundant p-bit parity signal from the triple-redundant error-correction encoder. DICE flip-flops are used in the data register and the parity register for static immunity against single-event transients at nodes within the flip-flops. Residual static errors latched by the DICE flip-flops are corrected by an error-correction decoder having data and parity inputs driven respectively by the outputs of the data and parity registers, preventing incorrect latched data from appearing at the error-corrected output. In some embodiments, single-event transients in the n-bit output of the error-correction decoder are mitigated by a triple-redundant glitch filter that produces an n-bit triple-redundant filtered output. In some embodiments, one or both of the data and parity registers have a reset input, which may be asynchronous, driven by a resilient majority driver accepting a triple-redundant reset input signal.

The single-event effect tolerant registers provided herein, using a single n-bit DICE data register and a single p-bit DICE parity register (where p<n) together with error-correction circuitry, is more compact than a full TMR register solution requiring three n-bit DICE data registers with majority voting. The resilient majority drivers are simple and compact and protect the various inputs of the DICE registers from mutiple error sources. The present solution scales very favorably with increasing data bus width n compared to simple TMR, in area, complexity, and power, while exhibiting excellent resilience to single-event effects and possessing superior fault tolerance.

Other features and advantages of the present invention will be apparent to those skilled in the art upon reference to the following detailed description taken in conjunction with the accompanying drawings, which are to be understood to be exemplary and explanatory, and are intended to provide further explanation of the invention as claimed.

DETAILED DESCRIPTION OF THE PREFERRED EMBODIMENTS

The following Detailed Description is merely exemplary in nature and is not intended to limit the various embodiments or the application and uses thereof. Furthermore, there is no intention to be bound by any theory presented in the preceding background or the following detailed description. The techniques and structures described below may be applied in fields and applications beyond those specified here as examples, and the disclosed invention is therefore not to be considered limited to the applications and examples used here for the sake of explaining its principles of operation.

Aside from permanent damage caused by radiation, or cumulative dose effects causing permanent performance degradation, CMOS integrated circuits operating in high-radiation environments such as space orbit are susceptible to transient or persistent errors caused by corruption of data in combinational logic as well as in sequential logic including data storage elements such as registers incorporating flip-flops. In space, nondestructive single-event effects (SEE) or "soft errors" are often caused an energetic ion traversing an electronic device and depositing a pulse of charge in the circuit, causing a voltage pulse known as a single-event transient (SET). SETs occurring in or around a storage element such as a register incorporating flip-flops, so as to affect data values that are latched, create a persistent error known as a single-event upset (SEU). Various storage element designs to minimize SEUs have been proposed, but in general they are not immune to transient errors caused by SETs, and may remain vulnerable to rare SEUs caused by SETs occurring at their inputs or outputs, e.g., during a flip-flop setup-and-hold time. Fault-tolerant systems that include storage elements are sometimes designed using techniques such as system-level triple-modular redundancy (TMR) and majority voting to reject errors. Replicating entire modules necessarily incurs significant size, cost, and power penalties. Error-correction encoding and decoding techniques are also used in data storage, with care taken in layout to maximize their benefit; they also have a known overhead, but fewer extra storage cells are required than for TMR. Novel designs for SEU-tolerant registers are described herein that use a combination of these techniques and others, and in particular, a novel input driver, referred to as a resilient majority driver, that protects storage element inputs from SETs at or upstream from the inputs.

Figure 1A:
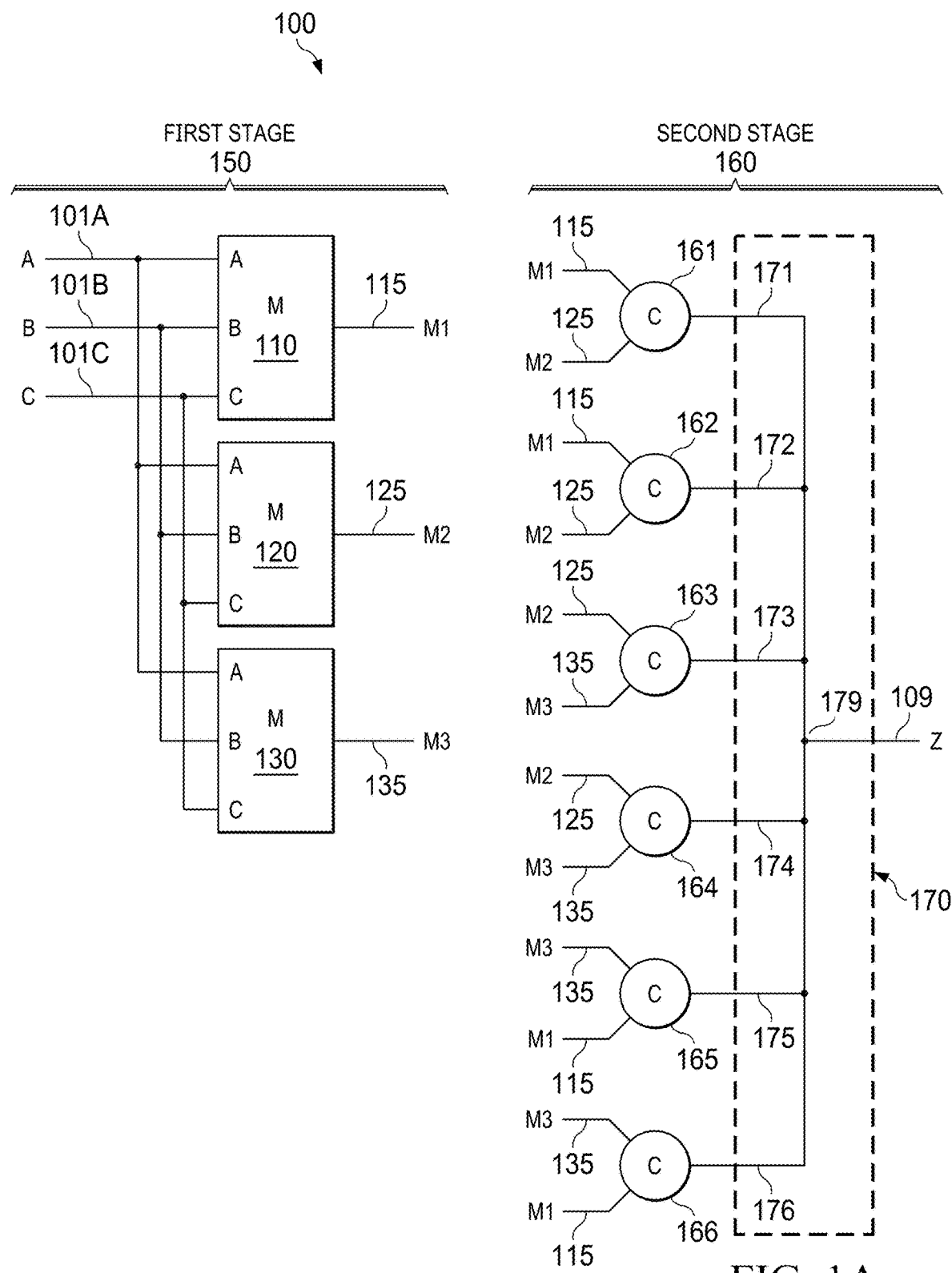
FIG. 1A is a schematic block diagram of a resilient majority driver.

Referring now to FIG. 1A, a schematic block diagram is shown of a resilient majority driver 100 capable of providing robust and error-free signals to the inputs of a data storage element (a latch, flip-flop, or register, hereinafter referred to as a "register"), and substantially immune to the effects of single-event transients occurring upstream from, or within, driver 100. Driver 100 is constructed of a first stage 150 and a second stage 160. First stage 150 accepts triple-redundant input signals 101A, 101B, and 101C that are nominally identical, meaning that during normal operation, that is, in the absence of errors on any of the input signals, signals 101A (redundant input A), 101B (redundant input B), and 101C (redundant input C) have the same digital logic value. The redundant input signals are all connected to the inputs A, B, and C of each of three digital majority voters 110, 120, and 130. (The majority voter block diagram symbols are rectangles labeled "M" to indicate a majority voting operation.) Digital majority voter 110 accepts all three signals 101A, 101B, and 101C and generates a majority output 115 (majority output M1), that outputs the same logic value as the majority of input signals A, B, and C. Similarly, digital majority voters 120 and 130 each also accept all three input signals and generate majority outputs 125 (M2) and 135 (M3). Majority outputs 115, 125, and 135 (M1, M2, and M3) constitute the outputs of first stage 150 that are applied to the inputs of second stage 160. As appreciated by those skilled in the art, majority voters 110, 120, and 130 may produce either noninverted (output voted signal has the same logic level as the majority of the input signals) or inverted outputs, and other inversions or negative logic may be used elsewhere in the circuitry.

A single digital majority voter such as voter 110 (or 120, or 130) is capable of resolving a single static error in signals 101A, 101B, or 101C on its inputs A, B, and C. But the output of a digital majority voter is a single point of failure, and thus a digital majority voter like 110 is vulnerable to single-event transients disturbing the state of its output 115, especially if the digital majority voter is not optimized for low output impedance, but is constructed using minimum-size transistors for high speed. Therefore, inputs of a register that are driven directly by a single digital majority voter would remain susceptible to single-event transients. Using triple-redundant digital majority voters 110, 120, and 130 in conjunction with the novel circuitry of second stage 160 addresses this vulnerability and protects the register from both static and transient errors.

Second stage 160 of resilient majority driver 100 uses a number of novel specialized two-input Muller C-elements 161 through 166, to be described in detail later with reference to FIGS. 3A and 3B. The number of C-elements is three, or a multiple of three, working together to perform a majority voting operation, as will be explained next. A minimal configuration for second stage 160 includes three Muller C-elements 161, 163, and 165, generating Muller C-element outputs 171, 173, and 175, respectively. Muller C-element 161 has two inputs connected respectively to majority output 115 (M1) from digital majority voter 110 in first stage 150, and to majority output 125 (M2) from digital majority voter 120. Muller C-element 163 has two inputs connected respectively to majority output 125 (M2) from digital majority voter 120 in first stage 150, and to majority output 135 (M3) from digital majority voter 130. Muller C-element 165 has two inputs connected respectively to majority output 135 (M3) from digital majority voter 130 in first stage 150, and to majority output 115 (M1) from digital majority voter 110. (The order of connection does not matter, as long as the proper combination of signals is connected to the two inputs of each of the Muller C-elements.) Each of the three Muller C-elements performs a portion (or "segment") of a majority voting operation, using a portion of a majority voter circuit referred to herein as a "voter segment," which will be described later in reference to FIGS. 2 and 3A. Muller C-element outputs 171, 173, and 175 are connected to a summing node 179. The connection of this combination of Muller C-element output "channels" to summing node 179 implements an analog majority voter 170 that performs a second majority voting operation on digital majority voter outputs 115, 125, and 135 (M1, M2, and M3), producing output signal 109 (Z) at the resilient majority driver output. This second, analog majority voting operation provides resilience to single-event transients (SET) at nodes anywhere within resilient majority driver 100, including in digital majority drivers 110, 120, and 130, and in any of Muller C-elements 161 through 166.

The resilience of an analog majority voter to SET or even to static disagreements among the voted signals is improved by using more than three summed signals or "channels," so that single signals that disagree are more completely dominated by the correct signals that are in agreement. The amplitude of an SET at the summed node is approximately one (one channel experiencing an SET) divided by the total number of voted signals. Thus, for three summed channels, a potential voltage change at the output would be approximately one-third (⅓) of the amplitude of an SET in one of the channels. This amplitude has a small but measurable probability of exceeding the difference in voltage between valid logic levels, and thus of providing a transient error at driver output 109. For this reason, it is preferable to increase the number of analog-voted channels above three, which in the embodiment shown in FIG. 1A is accomplished by doubling the number of C-elements, specifically, by duplicating the function of Muller C-elements 161, 163, and 165 with Muller C-elements 162, 164, and 166, applying the respective outputs 115, 125, and 135 from digital majority voters 110, 120, and 130 in the same combinations to the inputs of C-elements 162, 164, and 166 as to C-elements 161, 163, and 165, respectively. By doubling the number of C-elements that are summed at node 179 to six, the amplitude of a transient on driver output 109 caused by an SET in one of the six channels is reduced to one-sixth the voltage, which is definitely less than the difference between a logic 1 and a logic 0 in CMOS, and results in a negligible probability for an error caused by an SET. Mitigation of transients caused by energetic particles striking circuitry connected to summing node 179, thereby resulting in a driver substantially immune to SET overall, will be discussed later with reference to FIG. 3A.

Figure 1B:
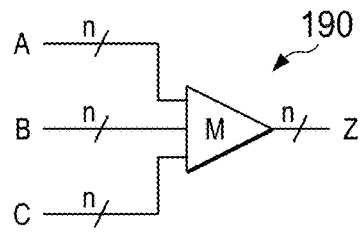
FIG. 1B is a schematic circuit symbol for an n-bit resilient majority driver.

A resilient majority driver 100 as shown in FIG. 1A is capable of handling a single-bit triple-redundant signal 101A, 101B, 101C (A, B, C). Resilient majority drivers 100 capable of handling n signals, for example n-bit data buses, may be constructed by replicating the circuitry of FIG. 1A n times. FIG. 1B shows a schematic circuit symbol 190 for an n-bit resilient majority driver. Each of triple-redundant inputs A, B, and C is an n-bit wide data bus, and the circuitry of FIG. 1A is represented by a triangular buffer labeled "M" to indicate a majority voting function. The n-wide resilient majority driver depicted using circuit symbol 190 accepts n-bit triple-redundant inputs and produces a single n-bit output Z.

Figure 1C:
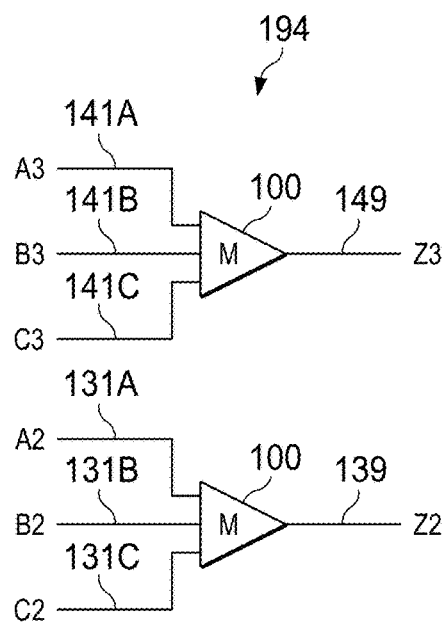
FIG. 1C is a schematic block diagram of an exemplary 4-bit resilient majority driver.
Figure 1C:
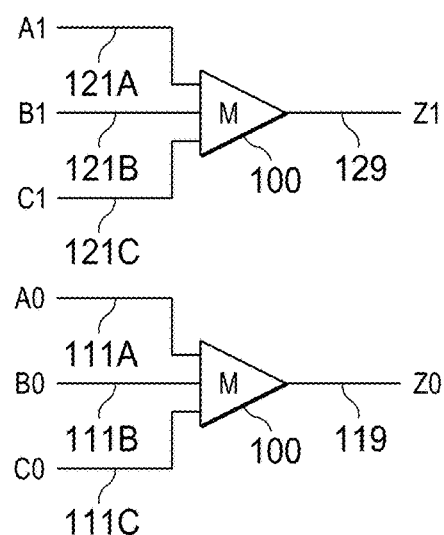

To explain how n-bit buses may be handled, now referring to FIG. 1C, a schematic block diagram is shown for an exemplary 4-bit wide resilient majority driver 194 accepting triple-redundant 4-bit wide inputs A0 . . . A3, B0 . . . B3, and C0 . . . C3, to produce a 4-bit wide driver output Z0 . . . Z3. Outputs 119, 129, 139, and 149 (Z0, Z1, Z2, and Z3, respectively) are produced bit-wise by four complete resilient majority drivers 100 as shown. Specifically, the first "zero" bits of input data buses A, B, and C, signals 111A (A0), 111B (B0), and 111C (C0), are accepted by a first resilient majority driver 100 to produce driver output 119 (Z0). "One" bits 121A (A1), 121B (B1), and 111C (C1) are input to a second resilient majority driver 100 that produces driver output 129 (Z1). In similar fashion, bits A2, B2, and C2 are accepted as inputs to a third majority driver 100 to produce third driver output bit 139 (Z2), and input bits A3, B3, and C3 are used in a fourth resilient majority driver 100 to produce fourth driver output bit 149 (Z3).

Figure 2:
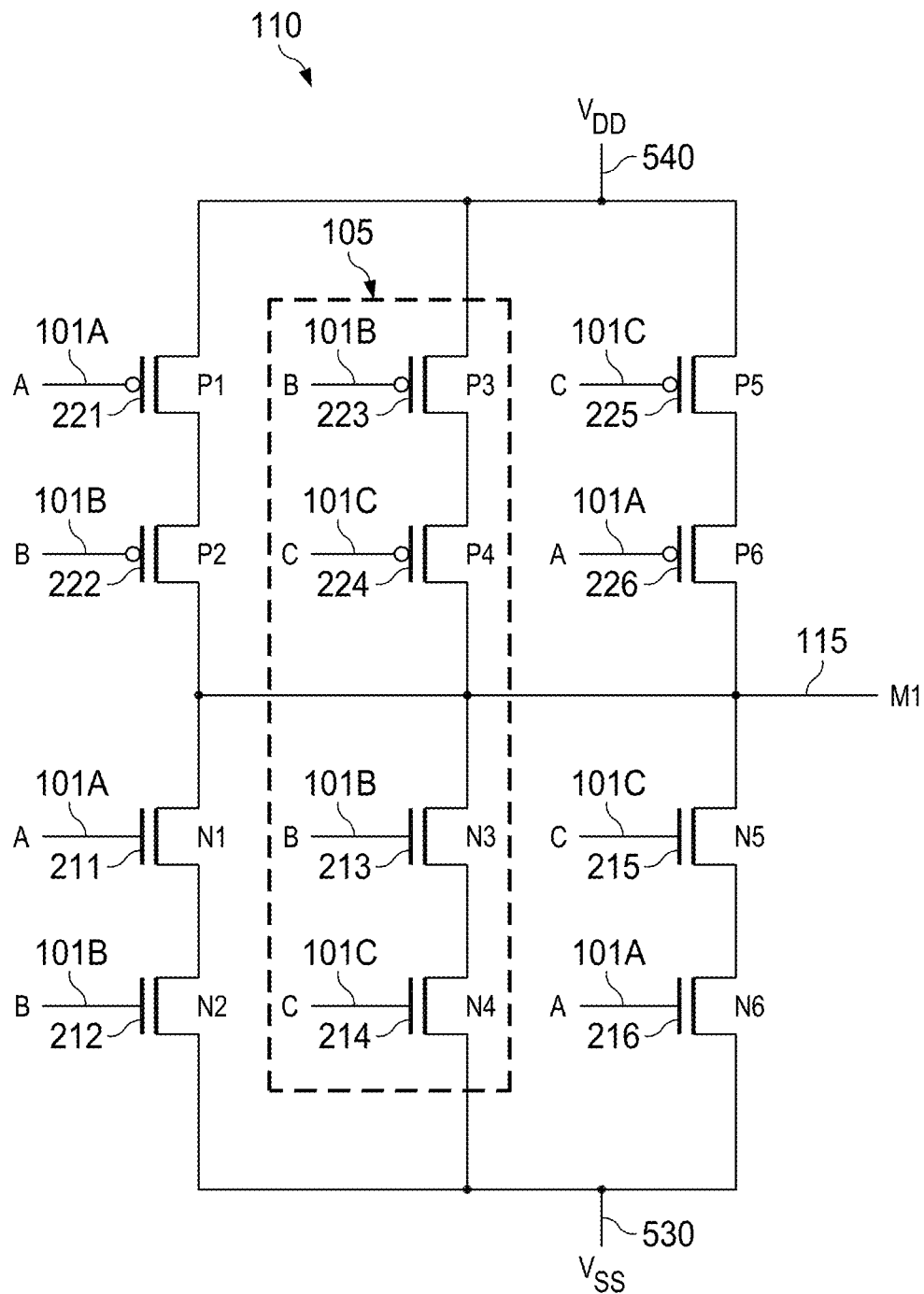
FIG. 2 is a schematic circuit diagram of a digital majority voter.

Now referring to FIG. 2, a schematic circuit diagram of a digital majority voter 110 (or 120 or 130) in a CMOS technology is presented, showing a compact implementation of the voters in first stage 150 of FIG. 1A. Digital majority voter 110 as shown accepts redundant normally-identical inputs 101A (A), 101B (B), and 101C (C), and in this example, produces an inverted majority output signal 115 (M1) according to the logic equation:

$$M1 = NOT[(A \text{ AND } B) \text{ OR } (B \text{ AND } C) \text{ OR } (A \text{ AND } C)]$$

As stated earlier, a digital majority voter 110 may produce a noninverted output (without the "NOT") or inverted output (with the "NOT"), which inversion may be dealt with elsewhere in the circuitry as needed, for example, by adding an inverter before the output. Such an optional inverter is omitted from FIG. 2 for simplicity. The architecture of this circuit consists of three "voter segments" 105, each voter segment accepting a pair of the triple-redundant input signals, which are applied to a series pair of NMOS transistors connected between a common output signal line 115 (M1) and negative supply 530 ($V_{SS}$), the NMOS pair in series with a series pair of PMOS transistors connected to positive supply 540 ($V_{DD}$) and driven by the same pair of input signals as shown. Specifically, for the center voter segment 105, input signals 101B and 101C (B and C) are applied to the gates of PMOS 223 (P3) and PMOS 224 (P4), connected in series as shown with the drain of PMOS 223 (P3) connected to positive supply 540 ($V_{DD}$), and the source of PMOS 223 connected in series to the drain of PMOS 224, whose source is connected to a common node serving as majority output 115. The same input signals 101B and 101C are connected to the gates of NMOS 213 (N3) and NMOS 214 (N4), which are connected source-to-drain in series between the common node and with the source of NMOS 214 (N4) connected to the negative supply 530 ($V_{SS}$). Two other voter segments are connected similarly, a left-hand (in this circuit schematic) segment made up of transistors 221, 222, 211, and 212 (P1, P2, N1, and N2), driven by inputs 101A and 101B (A and B), and a right-hand segment made up of transistors 225, 226, 215, and 216 (P5, P6, N5, and N6), driven by inputs 101C and 101A (C and A). The connection of the three voter segments 105 implements a wired-OR function in producing majority output signal 115 (M1). It will be apparent to those skilled in the art that the exact order of connection of the pairs of inputs to the series transistors in each segment is unimportant. For example, A and B can be interchanged within a voter segment, or signal 101A (A) can be applied to transistors 221 (P1) and 212 (N2) instead of 221 (P1) and 211 (N1), etc. The use of minimum-size transistors can make this circuit compact, efficient, and high-speed. Triple redundancy of signals 101A, 101B, and 101C corrects for single static errors, but output 115 (M1) is still vulnerable to SETs at nodes within voter 110. Such transient errors are handled by second stage 160 as described above in relation to FIG. 1A.

Figure 3A:
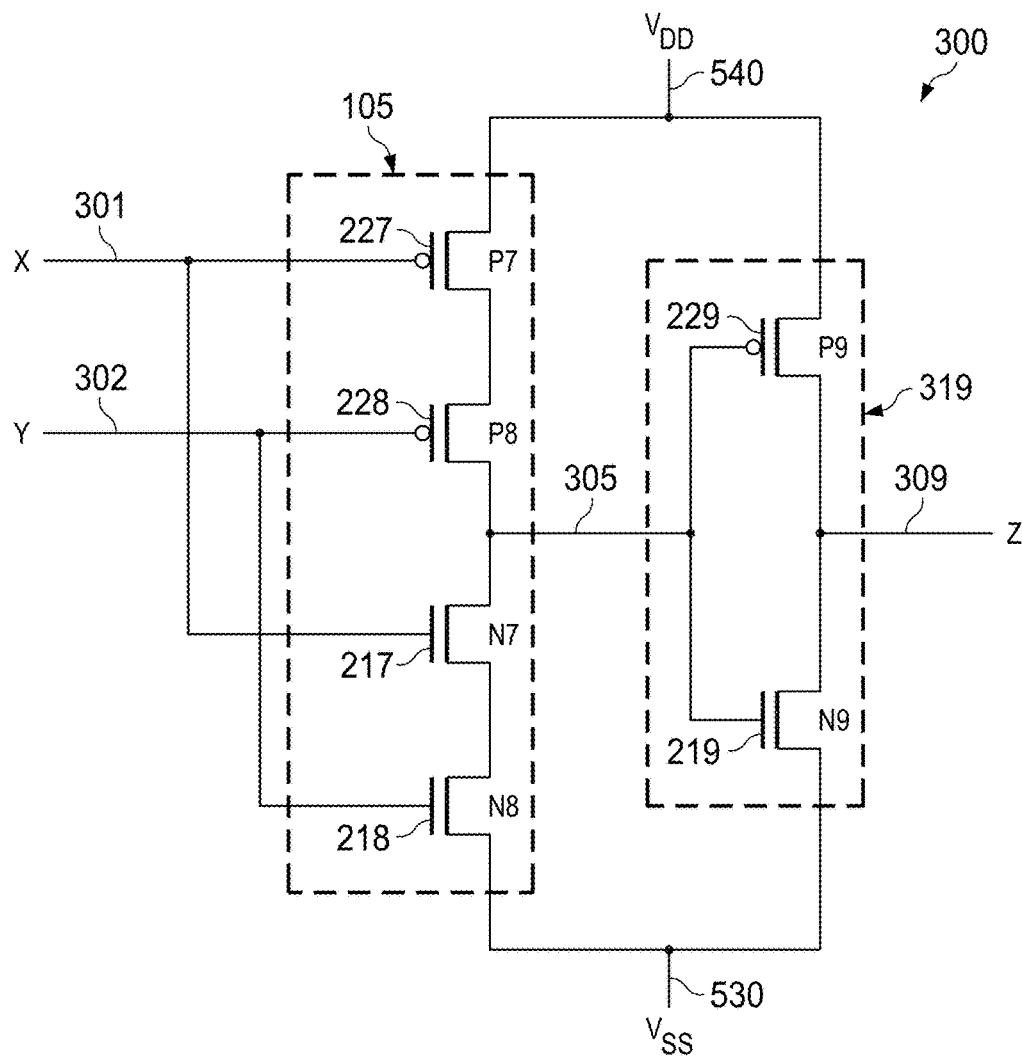
FIG. 3A is a schematic circuit diagram of a Muller C-element having a voter segment input.
Figure 3B:
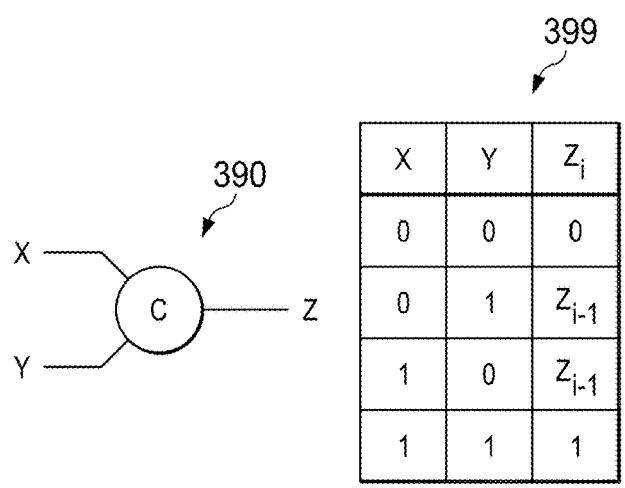
FIG. 3B shows the schematic circuit symbol and truth table for a Muller C-element.

Now referring to FIG. 3A, a schematic circuit diagram is shown of a novel Muller C-element 300 having a voter segment 105 accepting inputs 301 (X) and 302 (Y) and producing a noninverting output 309 (Z). C-element 300 may be used to implement C-elements 161 through 166 in second stage 160 as shown in FIG. 1A. An inverting version of C-element 300 lacking output stage 319 is possible, but it is preferable, for reasons soon to be discussed, to include an inverting output stage 319 as illustrated here. As in the digital majority voter 110, Muller C-element 300 incorporates a voter segment 105 consisting of series-connected PMOS transistors 227 (P7) and 228 (P8) and NMOS transistors 217 (N7) and 218 (N8), which implements a portion of the logic equation for a majority voter. Input signal 301 (X) is applied to the gates of PMOS transistor 227 (P7) and NMOS transistor 217 (N7), and signal 302 (Y) is applied to the gates of PMOS transistor 228 (P8) and NMOS transistor 218 (N8). Again, it will be apparent that it does not matter which of the two series PMOS transistors a first input signal is connected to, as long it is connected to one PMOS and one of the NMOS, and the second input to the other PMOS and the other NMOS to which the first input signal is not connected. Voter segment 105 implements a partial majority vote, as described above, at voter segment output node 305, which when summed with other voter segments from another two C-elements by connecting their outputs together (as described with respect to FIG. 1A), can implement a full analog majority vote. This would be an inverted majority vote as implemented by the version of digital voter 110 illustrated in FIG. 2. However, it is preferable to include inverting output stage 319 to produce a final Muller C-element output 309 (Z) as in FIG. 3A, for the following reason. When constructed of minimum-size transistors, voter segment 105 would have an output impedance that is greater than that of output stage 319 when implemented using the same size transistors, since voter segment 105 has two transistors in series to both supplies 530 ($V_{SS}$) and 540 ($V_{DD}$). To minimize susceptibility to SETs occurring in the circuitry connected to output 309, it is desirable to construct a low-impedance output stage 319 to bleed such transients to the supplies. Thus transistors 229 (P9) and 219 (N9) may be sized larger than a minimum size in order to provide a low-impedance driver. This is still relatively compact since the embodiment using output stage 319 as shown employs a simple two-transistor inverter. In order to achieve the same low impedance without an additional output stage 319, because the NMOS transistor pairs 217 and 218 and PMOS transistor pairs 227 and 228 are in series, each transistor would have to be twice the size, for a total area of four times the area of an output stage 319 having the same impedance. The embodiment shown, with properly-sized transistors 219 (N9) and 229 (P9), thus retains high speed for the voter segment while providing low impedance at the output stage.

Muller C-elements (also called other names such as a C-gate, hysteresis flip-flop, coincident flip-flop, or two-hand safety circuit) are a special type of flip-flop or gate widely used in the design of asynchronous circuits and systems. A Muller C-element outputs 0 when all inputs are 0, it outputs 1 when all inputs are 1, and it retains its output state otherwise (i.e., in the case of disagreement of the inputs). The circuit embodiment 300 shown in FIG. 3A acts as a Muller C-element for transients, meaning that it retains its previous output state in the case of transient disagreement of the inputs, for SETs occurring either at the inputs, within the voter segment transistors 217, 218, 227, or 228, or at the output 305 of the voter segment. This is because node capacitances effectively apply "inertia" to the output and are able to prevent a current transient due to an ion strike, which typically has a duration of significantly less than a nanosecond, from making both voter segment inputs disagree for long enough to change the Muller C-element output at node 309. A schematic circuit symbol 390 and the truth table 399 for such a transient Muller C-element 300 are presented in FIG. 3B. Circuit symbol 390 is used to represent element 300 in FIGS. 1A and 7A. The notation $Z_i$ in truth table 399 refers to the current state of the output 309 (Z), and $Z_{i-1}$ refers to the immediately preceding output state. Alternative circuit implementations of Muller C-elements other than the circuit shown in FIG. 3A can be used in other embodiments of resilient majority driver 100, but the novel Muller C-element 300 just described is very efficient in circuit area, power consumption, and high-speed performance.

Figure 4:
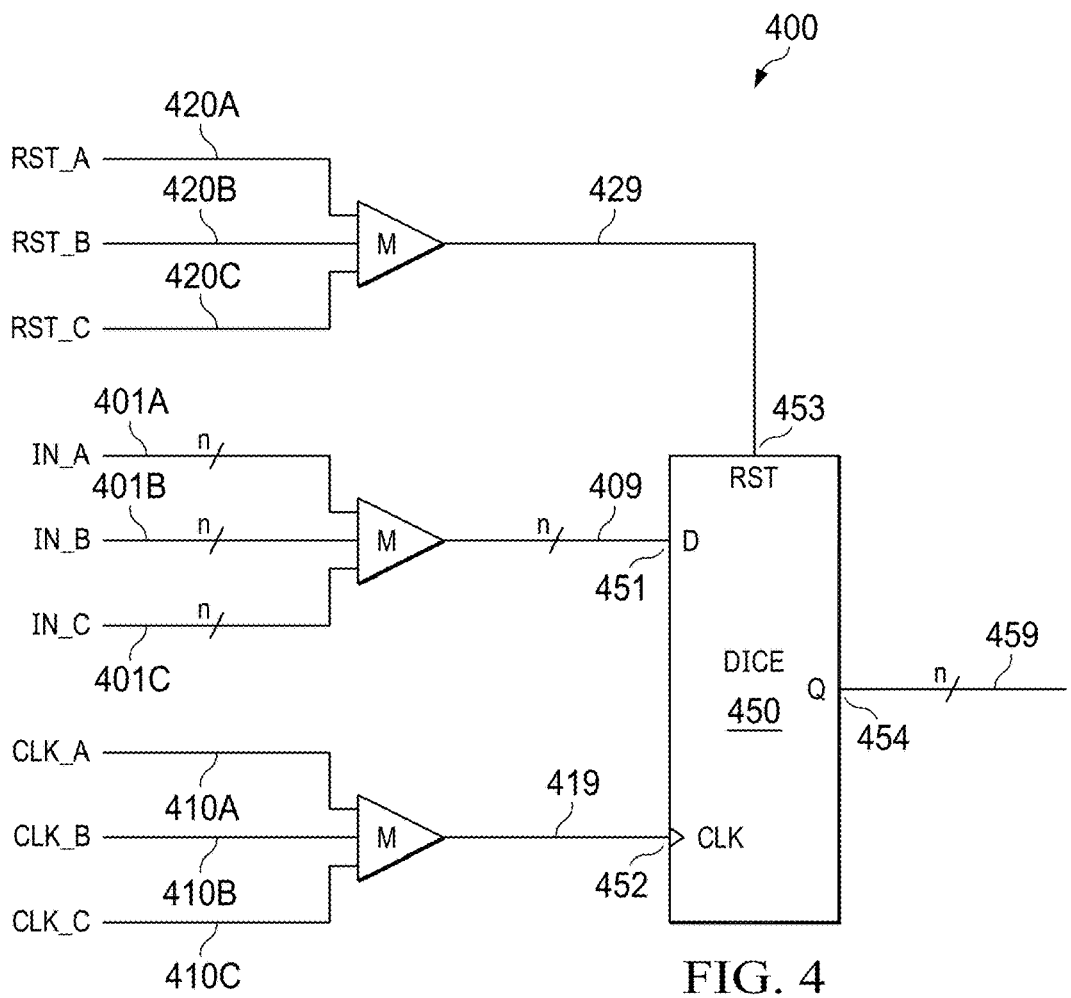
FIG. 4 is a schematic block diagram of an input-protected DICE register.

A schematic block diagram of an input-protected register 400 is shown in FIG. 4. Register 450 may consist of one or more flip-flops, and thus may have a number n=1 or more data inputs 451 (labeled D), at which it accepts an n-bit wide data signal 409 from an n-bit data bus, as well as an output 454 (Q) providing an output signal 459 of the same width n as input 451. In some embodiments, the register is made of D flip-flops, and in a preferred embodiment, the flip-flops use a Dual Interlocked storage CEll (DICE) architecture for resilience to SEU caused by SET at internal nodes after they have latched data. Clocked registers used in synchronous systems also have a clock input 452 (CLK) driven by a clock signal 419. Some registers 450 have one or more reset inputs 453 (RST), driven by reset signal 429 to set the state of the register (typically to all zeros called "clear," or to all ones, called "preset," but possibly to any other desired initial value). Reset input 453 is typically asynchronous, meaning that no clock is needed for the reset signal 429 to affect the state of the register.

Register 450 does not have inherent triple-redundant inputs, and it would be expensive in area and power to triplicate all the DICE flip-flops (already twice the size of a standard flip-flop) to implement them. Assuming that triple-redundant signals are available as inputs, using resilient majority drivers as described previously is a robust and area-efficient way to condition all the single-bit signals entering register 450, protecting the register inputs both from static errors and single-event transients. As shown in FIG. 4, an n-bit triple-redundant data input signals 401A (IN_A), 401B (IN_B), and 401C (IN_C) are accepted by a data resilient majority driver that produces an n-bit SET-resistant majority output bus 409 connected to register data input 451. Triple-redundant clock signals 410A (CLK_A), 410B (CLK_B), and 410C (CLK_C) are connected to the inputs of a clock resilient majority driver to produce a single robust clock signal 419 to drive clock input 452. And optional triple-redundant reset signals 420A (RST_A), 420B (RST_B), and 420C (RST_C) are accepted by a reset resilient majority driver to generate a single robust reset signal 429 connected to one or more flip-flops in register 450 via reset input 453. Input-protected register 400 is more resilient to single-event transients than prior art registers, but register output 459 (Q) may still be vulnerable to rare SETs occurring during setup-and-hold times of the register, even with the DICE architecture, or to SETs occurring right at Q output 454.

Figure 5:
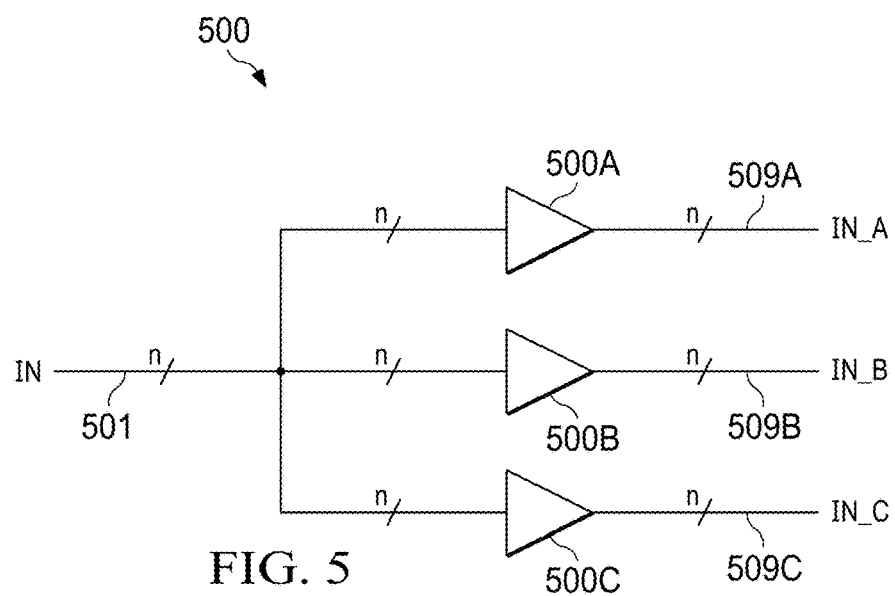
FIG. 5 is a schematic block diagram showing buffers used to generate triple-redundant signal buses.

Input-protected registers 400 require triple-redundant input signals for the resilient majority drivers to protect them. In the case that triple-redundant signals are not coming from a system that is already integrated with register 400, for example, if register 400 is to be used connected to external data inputs provided at input pads of an integrated circuit containing register 400, then a bus replicator circuit 500 as shown in FIG. 5 may be used to generate triple-redundant signal buses from a single input signal bus 501 (IN). Signal 501 is n bits wide, where n may be one (line) or more (a bus); clock signals and most reset signals are single lines, for which n=1. In the example illustrated, however, the input data bus 501 (IN) is n bits wide. Input 501 is split three ways and sent to the inputs of three n-bit buffers 500A, 500B, and 500C to generate triple-redundant data 509A (IN_A), 509B (IN_B), and 509C (IN_B), respectively. It is apparent that if input bus 501 is a data bus for an input-protected register 400, then triple-redundant buses 509A, 509B, and 509C may be connected, for example, to serve as triple-redundant data signals 401A (IN_A), 401B (IN_B), and 401C (IN_C) to apply to the inputs of a data resilient majority driver that generates robust majority input bus 409.

Figure 6:
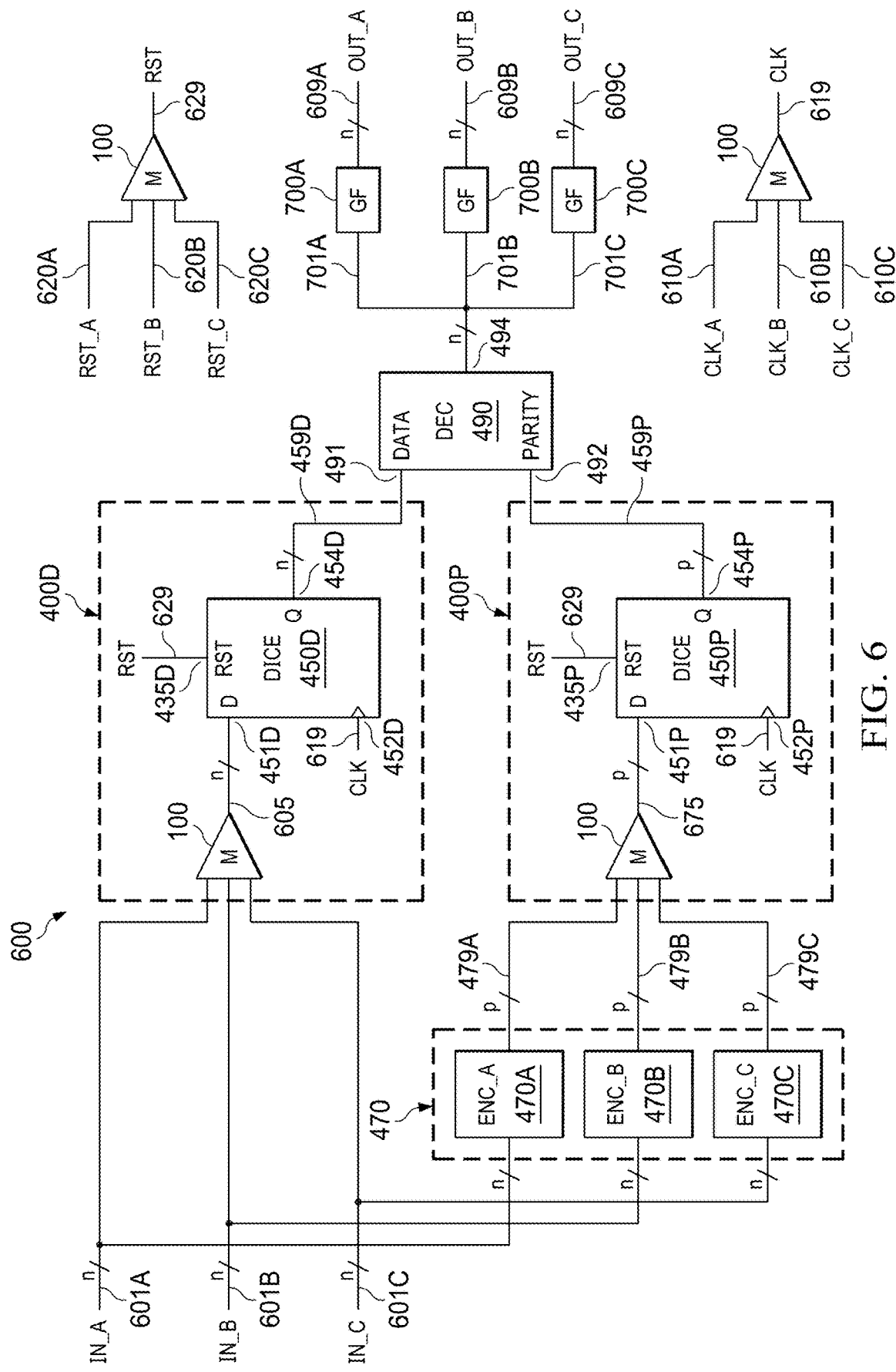
FIG. 6 is a schematic block diagram of a single-event effect tolerant register.

Referring now to FIG. 6, a fully single-event effect tolerant register 600 is depicted that is substantially immune to errors caused by SET as well as to static errors. Besides the use of resilient majority drivers 100 to implement input-protected registers 400D and 400P, register 600 has additional features to eliminate static errors due to single-event upsets in DICE registers 450D and 450P, and also due to SETs at the outputs. Specifically, an error detection and correction (EDAC) scheme using error-correction encoders and decoders is used to correct latched errors in the DICE registers in an area-efficient way, and triple-redundant glitch filters are used to generate a triple-redundant filtered output that masks transients occurring at the output of the error-correction decoder.

The inputs to SEE-tolerant register 600 are the three n-bit input data buses 601A (IN_A), 601B (IN_B), and 601C (IN_C). Triple-redundant n-bit input data buses 601A, 601B, and 601C are connected to the inputs of a resilient majority driver 100 that generates majority data bus 605 to drive D inputs 451D of input-protected data register 400D, and input buses 601A, 601B, and 601C are also connected to the inputs of a triple-redundant error-correction encoder 470 that includes encoders 470A (ENC_A). 470B (ENC_B), and 470C (ENC_C). Error-correction encoder 470 accepts the triple-redundant n-bit data input and processes the n data bits to output p parity bits in the form of triple-redundant p-bit parity signals 479A, 479B, and 479C. Triple-redundant p-bit parity signals 479A, 479B, and 479C are connected to the inputs of another resilient majority driver 100 that generates majority parity bus 675 to drive D inputs 451P of input-protected parity register 400P.

Resilient majority drivers 100 are also employed to generate SET-resilient clock and optional reset signals for input-protected registers 400D and 400P. In particular, triple-redundant clock signals 610A (CLK_A), 610B (CLK_B), and 610C (CLK_C) are applied to the inputs of a resilient majority driver 100 that generates majority clock signal 619 (CLK). Majority clock signal 619 is used to drive clock input 452D of DICE data register 450D, as well as clock input 452P of DICE parity register 450P. Similarly, triple-redundant reset signals 620A (RST_A), 620B (RST_B), and 620C (RST_C) are applied to the inputs of a resilient majority driver 100 that generates majority reset signal 629 (RST), which drives asynchronous reset inputs 453D of DICE data register 450D, and 453P of DICE parity register 450P.

Error-correction decoder 490 has a data input 491 and a parity input 492, and generates an error-connected n-bit output signal at corrected data output 494. A variety of error-correcting coding schemes are suitable for performing the error detection and correction (EDAC) scheme in various embodiments, but as an example, a Hamming encoder and decoder may be used since the expected error rate due to SETs is low. The size (number of bits p in width) of DICE parity register 450P determines how the width n in bits of DICE parity register 450D can be single-error corrected. Using a Hamming error-correcting code, the maximum number n of data bits that can be corrected by p parity is given by $$n = 2^p - p - 1$$

Thus, a Hamming encoder 470 that produces 3 parity bits can check and correct up to 4 data bits (for a total width of 7 bits stored, including those stored in both data register 450D and parity register 450P), 4 parity bits can check up to 11 data bits (total bits stored 15), and 5 parity bits can check up to 26 data bits (total stored=31). In other words, for an exemplary 8-bit data bus (n=8), 4 parity bits are required, since while 3 is insufficient, single errors in up to 11 data bits can be corrected by a Hamming decoder using 4 parity bits.

Data register output 459D from the Q output 454D of data register 450D and parity register output 459P from the Q output 454P of parity register 450P are applied respectively to data input 491 and parity input 492 of error-correction decoder 490, which is a Hamming decoder in those embodiments that implement a Hamming error-correction code with a Hamming encoder 470. Error-correction decoder 490 produces an n-bit wide error-corrected output signal at decoder output 494.

Example Verilog code to implement a single Hamming encoder of the three triple-redundant encoders 470A, 470B, and 470C for handling n=8-bit data to produce a p=4-bit parity word consisting of parity bits parity[0], parity[1], parity[2], and parity[3] in an exemplary embodiment is presented below:

```
module hamming_encode (data, parity);
    input wire [7:0]data;
    output wire [3:0]parity;
    localparam p0_mask=8'b0101_1011;
    localparam p1_mask=8'b0110_1101;
    localparam p2_mask=8'b1000_1110;
    localparam p3_mask=8'b1111_0000;
    assign parity[0]=^(data & p0_mask);
    assign parity[1]=^(data & p1_mask);
    assign parity[2]=^(data & p2_mask);
    assign parity[3]=^(data & p3_mask);
endmodule
```

Since a set of 4 parity bits can correct up to 11 data bits using a Hamming code, and only 8 data bits are corrected in this example, a different set of masks p0_mask, p1 mask, p2 mask, and p3 mask may be chosen to generate the 4 parity bits at an encoder output.

Then an exemplary triple-redundant 8-bit Hamming encoder 470 can be specified using the following Verilog code:

```
module tmr_hamming_encode(data1, data2, data3, parity1, parity2, parity3);
    input wire [7:0]data1;
    input wire [7:0]data2;
    input wire [7:0]data3;
    output wire [3:0]parity1;
    output wire [3:0]parity2;
    output wire [3:0]parity3;
    hamming_encode he1(.data(data1), .parity(parity1));
    hamming_encode he2(.data(data2), .parity(parity2));
    hamming_encode he3(.data(data3), .parity(parity3));
endmodule
```

Triple-modular redundant (TMR) Hamming encoder 470 simply consists of three instances (470A, 470B, and 470C) of the hamming_encode module, each producing a nominally-identical 4-bit parity word in the absence of transients or other errors. These three parity words parity1, parity2, and parity3 correspond to the triple-redundant parity signals 479A, 479B, and 479B that are applied to the inputs of resilient majority driver 100 forming part of input-protected parity register 400P, and are used by this resilient majority driver 100 to produce majority parity bus 675.

And finally, an exemplary Hamming decoder 490 producing an n=8-bit corrected data word can be implemented using the following Verilog code:

```
module hamming decode (data, parity, corrected data);
    input wire [7:0]data;
    input wire [3:0]parity;
    output wire [7:0]corrected data;
    wire [3:0]error_index;
    wire [12:0]correction mask;
    wire [11:0]combined_data;
    wire [11:0]combined_corrected;
    localparam p0_mask=8'b0101_1011;
    localparam p1_mask=8'b0110_1101;
    localparam p2_mask=8'b1000_1110;
    localparam p3 mask=8'b1111_0000;
    assign error_index[0]=^(data & p0_mask) ^parity[0];
    assign error_index[1]=^(data & p1 mask) ^parity[1];
    assign error_index[2]=^(data & p2_mask) ^parity[2];
    assign error_index[3]=^(data & p3_mask) ^parity[3];
    assign correction mask=(1'b1<<error_index)>>1;
    assign combined_data={data[7:4], parity[3], data[3:1], parity[2], data[0], parity[1], parity[0]};
    assign combined_corrected=combined_data ^correction mask;
    assign corrected data={combined_corrected[11:8], combined_corrected[6:4], combined_corrected[2]};
endmodule
```

It will be evident that the total number of bits to be stored in DICE registers is smaller for this EDAC approach than it would be for a naïve approach using triple-redundant DICE registers and majority voting, and that the complexity reduction and area advantage increases with data bus width. For the 8-bit data word example just given, the total number of bits stored in the combined data register 450D and parity register 450P are 8+4=12, whereas for simple TMR data registers, 24 bits (3×8) needed to be stored. For 16-bit data words, 16+5=21 bits would be stored using EDAC, compared to 48 (3×16) for TMR. This area advantage is multiplied when the inclusion of circuitry overhead required for design for test (DFT) is considered.

To complete a fully single-event effect tolerant register 600, errors due to SETs occurring in decoder 490, or from upstream signals 459D and 459P appearing at decoder output 494, may be masked using optional triple-redundant n-bit glitch filters 700A, 700B, and 700C, that generate robust triple-redundant n-bit output signals 609A (OUT_A), 609B (OUT_B), and 609C (OUT_C). Inputs 701A, 701B, and 701C of glitch filters 700A, 700B, and 700C, respectively, are all connected to output 494 of error-correction decoder 490, so that each operates on a copy of the n-bit error-corrected decoder output 494. Output signals 609A, 609B, and 609C form the output of fully SEE-tolerant register 600.

Glitch filters 700A, 700B, and 700C operate to remove transient voltage spikes that are shorter than a predetermined temporal duration and that could result in a short change in output logic level. Typical SET durations are less than one nanosecond. There exist a number of approaches to implement a glitch filter in CMOS. A basic approach that is compatible with the other circuitry described herein is illustrated in the simplified schematic block diagram shown in FIG. 7A. Glitch filter 700 accepts input signal 701 (A) and applies it to one input of a transient Muller C-element 300, which may be constructed using the techniques described in reference to FIG. 3A. Input signal 701 is also applied to the input of time-delay element 710, that generates time-delayed signal 705, which is connected to the other input of C-element 300. In the event that input 701 changes transiently to another logic state for a time period less than ti, a predetermined delay time inserted by delay element 710, Muller C-element 300 retains its output state as if input 701 had remained constant, thus delivering a stable output signal 709 (Y).

Figure 7A:
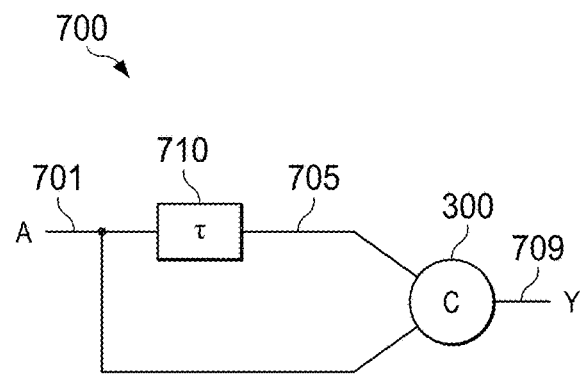
FIG. 7A is a simplified schematic block diagram of a glitch filter.
Figure 7B:
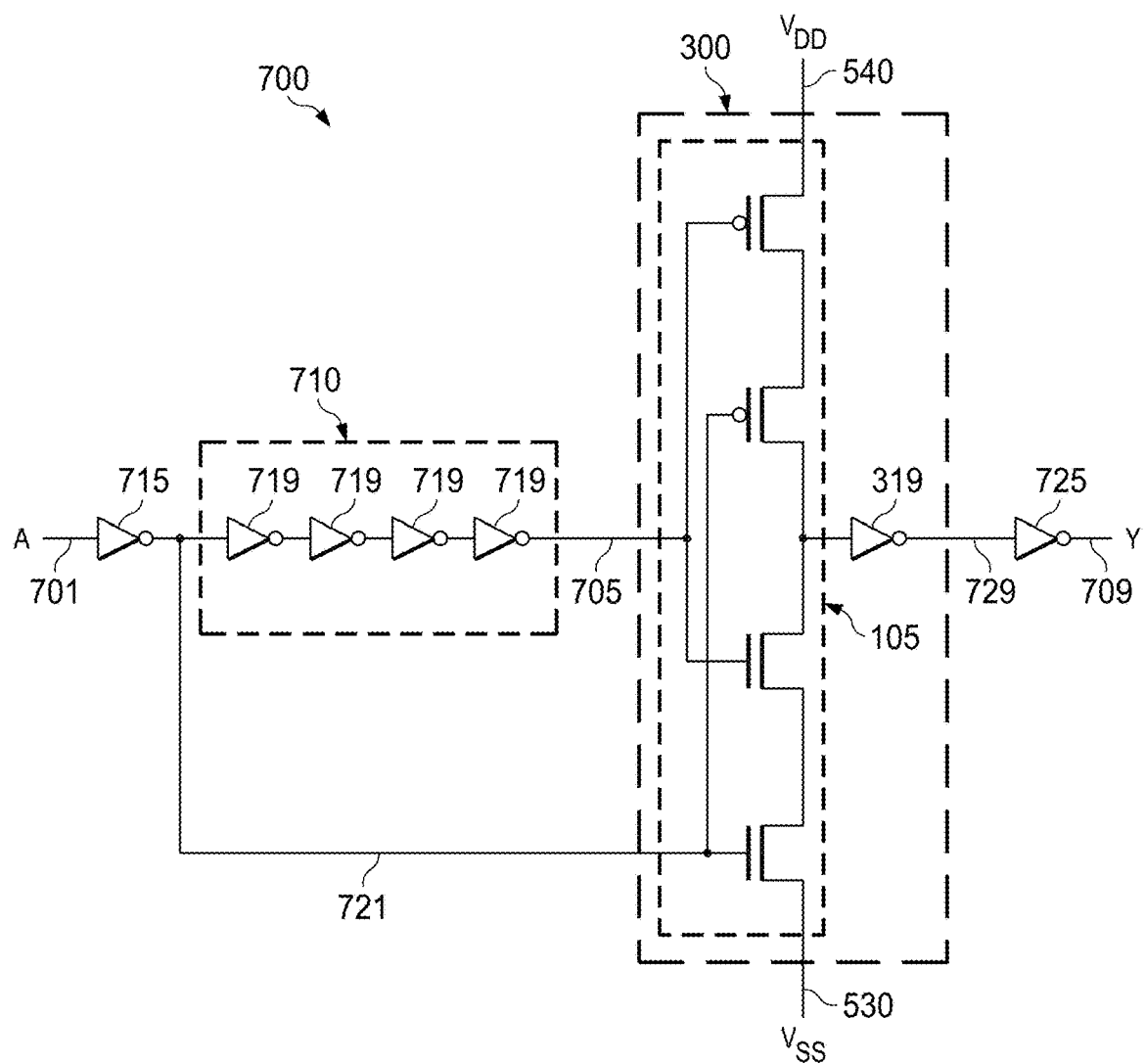
FIG. 7B is a more detailed schematic circuit diagram for a glitch filter.

Referring to FIG. 7B, a more detailed circuit schematic for a robust glitch filter 700 operating according to the principle of FIG. 7A is presented. Input signal 701 (A) is conditioned by input buffer 715 to present a reliable high-impedance input to decoder output 494, which is useful to minimize loading of input 701 when triplicate filters 700A, 700B, and 700C are implemented. Buffer 715 is shown as an inverting buffer, but could be noninverting to realize a different polarity for logic output 709 (Y). Output 721 of buffer 715 is connected to one input of Muller C-element 300 and also to the input of delay element 710, which is implemented in this embodiment as a series of four delay inverters 719, but could be implemented alternatively by using a different delay element design, or by using a different number of inverters to deliver a delayed signal 705 having a different delay time ti. The internal circuitry of Muller C-element 300 is shown schematically as using the same configuration of FIG. 3A, with the inputs received by voter segment 105, the output of which drives inverting output stage 319 to generate filtered signal 729. Filtered signal 729 may be further buffered by optional output buffer 725. Output buffer 725 in the embodiment shown in FIG. 7B is shown as inverting, but like input buffer 715 may be optionally noninverting depending on the application. Using the combination of voter segment 105 and inverters shown in FIG. 7B, a glitch filter that is noninverting overall (i.e., Y has the same value as A) is achieved.

Including all of the novel protective features illustrated in FIG. 6 results in a register 600 that is essentially immune to static input errors, and also to single-event effects (SEE) that include both latched single-event upset (SEU) errors and short-duration effects caused by single-event transients (SET). Incorrect latched data are never provided at output 709 (Y), and hence, no continuous clock is required to latch corrected data at a later clock cycle.

While the present invention has been particularly shown and described in detail in the foregoing specification with reference to preferred embodiments thereof, it will be evident that various modifications and changes may be made thereto without departing from the broader spirit and scope of the invention as set forth in the appended claims. For example, it will be apparent to those skilled in the art that different types of error-correction circuitry may be used in alternative embodiments, as well as different implementations of glitch filters, digital majority voters, and Muller C-elements. Negative logic or positive logic implementations may be alternatively employed using well-known principles of digital synthesis. Additional components and conventional connections not explicitly drawn nor described may be used in implementing various embodiments without departing from the scope of the invention. Other integrated circuit technologies alternative to CMOS may also benefit from applying the principles taught herein.

Besides in complete single-event effect tolerant registers, resilient majority drivers and input-protected flip-flops or registers may be applied separately and usefully in various space and terrestrial systems to improve resilience to single-event transients and single-event upsets. Other applications of these techniques will also be apparent, and therefore the scope of the invention is much broader than the few specific examples described herein. The specification and drawings are, accordingly, to be regarded in an illustrative rather than a restrictive sense.

We claim:

1. A resilient majority driver accepting triple-redundant input signals, comprising:
    a first stage, comprising
        a first digital majority voter having inputs connected to the input signals and generating a first majority output,
        a second digital majority voter having inputs connected to the input signals and generating a second majority output, and
        a third digital majority voter having inputs connected to the input signals and generating a third majority output; and
    a second stage, comprising
        a first Muller C-element comprising a voter segment having two inputs connected respectively to the first majority output and the second majority output,
        a second Muller C-element comprising a voter segment having two inputs connected respectively to the second majority output and the third majority output, and
        a third Muller C-element comprising a voter segment having two inputs connected respectively to the first majority output and the third majority output,
        each Muller C-element generating a Muller C-element output that reflects agreement of the two inputs and retains its state when the two inputs disagree transiently or a single-event transient occurs at an internal node, the Muller C-element outputs connected together at a summing node to produce a signal at a driver output resulting from an analog majority vote of the first, second, and third majority outputs,
    whereby the signal at the driver output is resilient to static single errors at the triple-redundant input signals and to transient errors due to single-event transients at any node in the resilient majority driver.

2. The resilient majority driver of claim 1, further comprising:
    a fourth Muller C-element comprising a voter segment having two inputs connected respectively to the first majority output and the second majority output;
    a fifth Muller C-element comprising a voter segment having two inputs connected respectively to the second majority output and the third majority output; and
    a sixth Muller C-element comprising a voter segment having two inputs connected respectively to the first majority output and the third majority output,
    each of the fourth, fifth, and sixth Muller C-elements generating a Muller C-element output that reflects agreement of the two inputs and retains its state when the two inputs disagree transiently or a single-event transient occurs at an internal node, the outputs of the fourth, fifth, and sixth Muller C-elements also connected to the summing node to produce a total driver output signal resulting from an analog majority vote of the first, second, third, fourth, fifth, and sixth majority outputs, whereby a single-event transient in one of the six Muller C-elements results in a transient on the total driver output signal that is smaller in amplitude than a transient that would be caused by the same single event in one of the first, second, or third Muller C-elements in the absence of the fourth, fifth, and sixth Muller C-elements.

3. The resilient majority driver of claim 2, wherein each Muller C-element further comprises an output stage configured to have a low output impedance, the output stage having an input connected to an output of the voter segment and an output connected to the Muller C-element output.

4. The resilient majority driver of claim 3, wherein the output stage is inverting.

5. The resilient majority driver of claim 1, wherein each Muller C-element further comprises an output stage configured to have a low output impedance, the output stage having an input connected to an output of the voter segment and an output connected to the Muller C-element output.

6. The resilient majority driver of claim 5, wherein the output stage is inverting.

7. An input-protected register, comprising:
    at least one flip-flop having a data input, a clock input, and an output;
    a data resilient majority driver having an input accepting a set of triple-redundant data input signals and an output connected to the data input of the flip-flop; and
    a clock resilient majority driver having an input accepting a set of triple-redundant clock input signals and an output connected to the clock input of the flip-flop,
    wherein each of the data and clock resilient majority drivers comprises
        a first stage, comprising
            a first digital majority voter having inputs connected to the resilient majority driver's set of input signals and generating a first majority output,
            a second digital majority voter having inputs connected to the resilient majority driver's set of input signals and generating a second majority output, and
            a third digital majority voter having inputs connected to the resilient majority driver's set of input signals and generating a third majority output, and
        a second stage, comprising
            a first Muller C-element comprising a voter segment having two inputs connected respectively to the first majority output and the second majority output,
            a second Muller C-element comprising a voter segment having two inputs connected respectively to the second majority output and the third majority output, and
            a third Muller C-element comprising a voter segment having two inputs connected respectively to the first majority output and the third majority output,
            each Muller C-element generating a Muller C-element output that reflects agreement of the two inputs and retains its state when the two inputs disagree transiently or a single-event transient occurs at an internal node, the Muller C-element outputs connected together at a summing node to produce a signal at a driver output resulting from an analog majority vote of the first, second, and third majority outputs, whereby the register is protected against errors caused by single-event transients entering the data input or the clock input of any flip-flop.

8. The input-protected register of claim 7, each second stage further comprising:
a fourth Muller C-element comprising a voter segment having two inputs connected respectively to the first majority output and the second majority output;
a fifth Muller C-element comprising a voter segment having two inputs connected respectively to the second majority output and the third majority output; and
a sixth Muller C-element comprising a voter segment having two inputs connected respectively to the first majority output and the third majority output,
each of the fourth, fifth, and sixth Muller C-elements generating a Muller C-element output that reflects agreement of the two inputs and retains its state when the two inputs disagree transiently or a single-event transient occurs at an internal node, the outputs of the fourth, fifth, and sixth Muller C-elements also connected to the summing node to produce a total driver output signal resulting from an analog majority vote of the first, second, third, fourth, fifth, and sixth majority outputs, whereby a single-event transient in one of the six Muller C-elements results in a transient on the total driver output signal that is smaller in amplitude than a transient that would be caused by the same single event in one of the first, second, or third Muller C-elements in the absence of the fourth, fifth, and sixth Muller C-elements.

9. The input-protected register of claim 7, wherein the register comprises an n-bit wide register having n data inputs, a clock input, and n outputs, each of the triple-redundant data signals is n bits wide, and the data resilient majority driver comprises n single resilient majority drivers, each single resilient majority driver connected to a triple-redundant bit of the data signal and producing a single bit of an n-bit wide driver output, the n bits of the driver output respectively connected to the n data inputs of the register.

10. The input-protected register of claim 7, wherein the flip-flop is a D flip-flop.

11. The input-protected register of claim 7, wherein the flip-flop has a Dual Interlocked storage CEll (DICE) latch architecture, whereby the register is protected against single-event upset errors caused by single-event transients at internal nodes in the flip-flop.

12. The input-protected register of claim 11, each second stage further comprising:
a fourth Muller C-element comprising a voter segment having two inputs connected respectively to the first majority output and the second majority output;
a fifth Muller C-element comprising a voter segment having two inputs connected respectively to the second majority output and the third majority output; and
a sixth Muller C-element comprising a voter segment having two inputs connected respectively to the first majority output and the third majority output,
each of the fourth, fifth, and sixth Muller C-elements generating a Muller C-element output that reflects agreement of the two inputs and retains its state when the two inputs disagree transiently or a single-event transient occurs at an internal node, the outputs of the fourth, fifth, and sixth Muller C-elements also connected to the summing node to produce a total driver output signal resulting from an analog majority vote of the first, second, third, fourth, fifth, and sixth majority outputs, whereby a single-event transient in one of the six Muller C-elements results in a transient on the total driver output signal that is smaller in amplitude than a transient that would be caused by the same single event in one of the first, second, or third Muller C-elements in the absence of the fourth, fifth, and sixth Muller C-elements.

13. The input-protected register of claim 7, wherein one or more of the flip-flops have a reset input connected to the output of a reset resilient majority driver accepting a triple-redundant reset input signal, wherein the reset resilient majority driver comprises:
a first stage, comprising
a first digital majority voter having inputs connected to the input signals and generating a first majority output,
a second digital majority voter having inputs connected to the input signals and generating a second majority output, and
a third digital majority voter having inputs connected to the input signals and generating a third majority output, and
a second stage, comprising
a first Muller C-element comprising a voter segment having two inputs connected respectively to the first majority output and the second majority output,
a second Muller C-element comprising a voter segment having two inputs connected respectively to the second majority output and the third majority output, and
a third Muller C-element comprising a voter segment having two inputs connected respectively to the first majority output and the third majority output,
each Muller C-element generating a Muller C-element output that reflects agreement of the two inputs and retains its state when the two inputs disagree transiently or a single-event transient occurs at an internal node, the Muller C-element outputs connected together at a summing node to produce a signal at a driver output resulting from an analog majority vote of the first, second, and third majority outputs,
whereby the register is protected against errors caused by single-event transients entering the asynchronous reset input as well as the data input or the clock input of any flip-flop.

14. The input-protected register of claim 13, the second stage of the reset resilient majority driver further comprising:
a fourth Muller C-element comprising a voter segment having two inputs connected respectively to the first majority output and the second majority output;
a fifth Muller C-element comprising a voter segment having two inputs connected respectively to the second majority output and the third majority output; and
a sixth Muller C-element comprising a voter segment having two inputs connected respectively to the first majority output and the third majority output,
each of the fourth, fifth, and sixth Muller C-elements generating a Muller C-element output that reflects agreement of the two inputs and retains its state when the two inputs disagree transiently or a single-event transient occurs at an internal node, the outputs of the fourth, fifth, and sixth Muller C-elements also connected to the summing node to produce a total driver output signal resulting from an analog majority vote of the first, second, third, fourth, fifth, and sixth majority outputs, whereby a single-event transient in one of the six Muller C-elements results in a transient on the total driver output signal that is smaller in amplitude than a transient that would be caused by the same single event in one of the first, second, or third Muller C-elements in the absence of the fourth, fifth, and sixth Muller C-elements.

15. A single-event effect tolerant register accepting a triple-redundant n-bit wide data input signal and a triple-redundant clock signal, comprising:
a triple-redundant error-correction encoder having inputs connected to the triple-redundant n-bit wide data input signal and producing a triple-redundant p-bit wide parity encoded signal;
a data register having n data outputs, n data inputs driven by the outputs of n first resilient majority drivers whose inputs are connected to the triple-redundant n-bit wide data input signal, and a clock input driven by a majority clock signal generated by a second resilient majority driver having inputs driven by the triple-redundant clock signal;
a parity register having p data outputs, p data inputs driven by the outputs of p third resilient majority drivers whose inputs are connected to the triple-redundant p-bit wide parity encoded signal, and a clock input driven by the majority clock signal;
the data and parity registers comprising flip-flops having a Dual Interlocked storage CEll (DICE) latch architecture, and the first, second, and third resilient majority drivers each comprising
a first stage, comprising
a first digital majority voter having inputs connected to the input signals and generating a first majority output,
a second digital majority voter having inputs connected to the input signals and generating a second majority output, and
a third digital majority voter having inputs connected to the input signals and generating a third majority output, and
a second stage, comprising
a first Muller C-element comprising a voter segment having two inputs connected respectively to the first majority output and the second majority output,
a second Muller C-element comprising a voter segment having two inputs connected respectively to the second majority output and the third majority output, and
a third Muller C-element comprising a voter segment having two inputs connected respectively to the first majority output and the third majority output,
each Muller C-element generating a Muller C-element output that reflects agreement of the two inputs and retains its state when the two inputs disagree transiently or a single-event transient occurs at an internal node, the Muller C-element outputs connected together at a summing node to produce a signal at a driver output resulting from an analog majority vote of the first, second, and third majority outputs; and
an error-correction decoder having an n-bit wide data input connected to the outputs of the data register and a p-bit wide parity input connected to the outputs of the parity register, producing an n-bit wide error-corrected output signal.

16. The single-event effect tolerant register of claim 15, wherein the triple-redundant error-correction encoder and the error-correction decoder use a Hamming code.

17. The single-event effect tolerant register of claim 15, each second stage further comprising:
a fourth Muller C-element comprising a voter segment having two inputs connected respectively to the first majority output and the second majority output;
a fifth Muller C-element comprising a voter segment having two inputs connected respectively to the second majority output and the third majority output; and
a sixth Muller C-element comprising a voter segment having two inputs connected respectively to the first majority output and the third majority output,
each of the fourth, fifth, and sixth Muller C-elements generating a Muller C-element output that reflects agreement of the two inputs and retains its state when the two inputs disagree transiently or a single-event transient occurs at an internal node, the outputs of the fourth, fifth, and sixth Muller C-elements also connected to the summing node to produce a total driver output signal resulting from an analog majority vote of the first, second, third, fourth, fifth, and sixth majority outputs, whereby a single-event transient in one of the six Muller C-elements results in a transient on the total driver output signal that is smaller in amplitude than a transient that would be caused by the same single event in one of the first, second, or third Muller C-elements in the absence of the fourth, fifth, and sixth Muller C-elements.

18. The single-event effect tolerant register of claim 17, wherein the triple-redundant error-correction encoder and the error-correction decoder use a Hamming code.

19. The single-event effect tolerant register of claim 17, further comprising a triple-redundant glitch filter having inputs connected to the n-bit wide error-corrected output signal and producing a triple-redundant n-bit wide filtered output.

20. The single-event effect tolerant register of claim 19, wherein the triple-redundant error-correction encoder and the error-correction decoder use a Hamming code.

21. The single-event effect tolerant register of claim 15, further comprising a triple-redundant glitch filter having inputs connected to the n-bit wide error-corrected output signal and producing a triple-redundant n-bit wide filtered output.

22. The single-event effect tolerant register of claim 21, wherein each glitch filter comprises a delay element generating a delayed signal from one bit of the error-corrected output signal, and a Muller C-element that has one input connected to the delayed signal and one input connected to an undelayed version of the same bit of the error-corrected output signal.

23. The single-event effect tolerant register of claim 15, further comprising a fourth resilient majority driver accepting a triple-redundant reset input signal and having an output connected to a reset input on each of the data and parity registers, wherein the fourth resilient majority driver comprises:
a first stage, comprising
a first digital majority voter having inputs connected to the input signals and generating a first majority output,
a second digital majority voter having inputs connected to the input signals and generating a second majority output, and
a third digital majority voter having inputs connected to the input signals and generating a third majority output, and
a second stage, comprising a first Muller C-element comprising a voter segment having two inputs connected respectively to the first majority output and the second majority output, a second Muller C-element comprising a voter segment having two inputs connected respectively to the second majority output and the third majority output, and a third Muller C-element comprising a voter segment having two inputs connected respectively to the first majority output and the third majority output, each Muller C-element generating a Muller C-element output that reflects agreement of the two inputs and retains its state when the two inputs disagree transiently or a single-event transient occurs at an internal node, the Muller C-element outputs connected together at a summing node to produce a signal at a driver output resulting from an analog majority vote of the first, second, and third majority outputs.

24. The single-event effect tolerant register of claim 23, the second stage of the fourth resilient majority driver further comprising:

a fourth Muller C-element comprising a voter segment having two inputs connected respectively to the first majority output and the second majority output;

a fifth Muller C-element comprising a voter segment having two inputs connected respectively to the second majority output and the third majority output; and a sixth Muller C-element comprising a voter segment having two inputs connected respectively to the first majority output and the third majority output, each of the fourth, fifth, and sixth Muller C-elements generating a Muller C-element output that reflects agreement of the two inputs and retains its state when the two inputs disagree transiently or a single-event transient occurs at an internal node, the outputs of the fourth, fifth, and sixth Muller C-elements also connected to the summing node to produce a total driver output signal resulting from an analog majority vote of the first, second, third, fourth, fifth, and sixth majority outputs, whereby a single-event transient in one of the six Muller C-elements results in a transient on the total driver output signal that is smaller in amplitude than a transient that would be caused by the same single event in one of the first, second, or third Muller C-elements in the absence of the fourth, fifth, and sixth Muller C-elements.

* * * * *